United States Patent
Krieger et al.

(10) Patent No.: US 10,534,042 B2
(45) Date of Patent: Jan. 14, 2020

(54) BUS SYSTEM AND METHOD FOR DIAGNOSING A SHORT CIRCUIT

(71) Applicant: VOLKSWAGEN AKTIENGESELLSCHAFT, Wolfsburg (DE)

(72) Inventors: Olaf Krieger, Lostau (DE); Lothar Claus, Königslutter (DE)

(73) Assignee: VOLKSWAGEN AKTIENGESELLSCHAFT (DE)

( * ) Notice: Subject to any disclaimer, the term of this patent is extended or adjusted under 35 U.S.C. 154(b) by 0 days.

(21) Appl. No.: 15/748,742

(22) PCT Filed: Oct. 6, 2016

(86) PCT No.: PCT/EP2016/073921
§ 371 (c)(1),
(2) Date: Jan. 30, 2018

(87) PCT Pub. No.: WO2017/076572
PCT Pub. Date: May 11, 2017

(65) Prior Publication Data
US 2018/0372807 A1   Dec. 27, 2018

(30) Foreign Application Priority Data

Nov. 6, 2015  (DE) .......... 10 2015 221 848

(51) Int. Cl.
*G01R 31/14* (2006.01)
*G01R 31/40* (2014.01)
(Continued)

(52) U.S. Cl.
CPC ............. *G01R 31/40* (2013.01); *G01R 27/18* (2013.01); *G01R 31/024* (2013.01);
(Continued)

(58) Field of Classification Search
CPC ...... G01R 31/025; G01R 27/18; G01R 31/40; G01R 31/024; G01R 31/42; G01R 31/006
(Continued)

(56) References Cited

U.S. PATENT DOCUMENTS

2006/0146942 A1* 7/2006 Elend .................... H04L 25/061
375/257
2009/0160479 A1* 6/2009 Lange ................. H04L 25/0298
326/30
(Continued)

FOREIGN PATENT DOCUMENTS

DE      3342763 A1   6/1985
DE     19525350 A1   1/1997
(Continued)

OTHER PUBLICATIONS

DE 3342763 machine translation, Jun. 5, 1985 (Year: 1985).*
(Continued)

*Primary Examiner* — Raul J Rios Russo
(74) *Attorney, Agent, or Firm* — Barnes & Thornburg LLP

(57) ABSTRACT

A bus system having at least two control devices, each of which has a bus driver. The bus drivers are connected together via at least two bus lines, each of which is equipped with at least one coupling capacitor. A terminal network is connected to the bus lines and consists of at least two resistors and a capacitor; each of the two resistors is connected to one of the bus lines and the resistors are connected together at a central tap. The capacitor of the terminal network lies between the central tap and a ground connection, and the bus system has a reference voltage source. The reference voltage source is connected to the central tap via
(Continued)

an element. The voltage of the reference voltage source has a value between an operating voltage of the bus system and ground.

16 Claims, 1 Drawing Sheet

(51) Int. Cl.
*G06F 13/40* (2006.01)
*G01R 27/18* (2006.01)
*G01R 31/02* (2006.01)
*G01R 31/42* (2006.01)
*G01R 31/00* (2006.01)

(52) U.S. Cl.
CPC ....... *G01R 31/025* (2013.01); *G06F 13/4027* (2013.01); *G06F 13/4072* (2013.01); *G01R 31/006* (2013.01); *G01R 31/42* (2013.01)

(58) Field of Classification Search
USPC ............... 324/500, 508, 509, 541, 544, 551
See application file for complete search history.

(56) References Cited

U.S. PATENT DOCUMENTS

| 2010/0017661 A1* | 1/2010 | Queck | H04L 12/40006 714/43 |
| 2010/0033163 A1* | 2/2010 | Ahrens | H04L 25/08 324/76.11 |
| 2011/0199131 A1* | 8/2011 | Boezen | H04L 25/028 327/109 |

FOREIGN PATENT DOCUMENTS

| DE | 19850672 A1 | 5/2000 |
| DE | 10237696 B3 | 4/2004 |
| DE | 102004056305 A1 | 7/2005 |
| DE | 102008002946 A1 | 1/2010 |
| DE | 102008052781 A1 | 4/2010 |

OTHER PUBLICATIONS

DE 10237696 machine translation, Apr. 15, 2004 (Year: 2004).*
Search Report for German Patent Application No. 10 2015 221 848.1; dated Jun. 24, 2016.
Search Report for International Patent Application No. PCT/EP2016/073921, dated Dec. 1, 2016.

\* cited by examiner

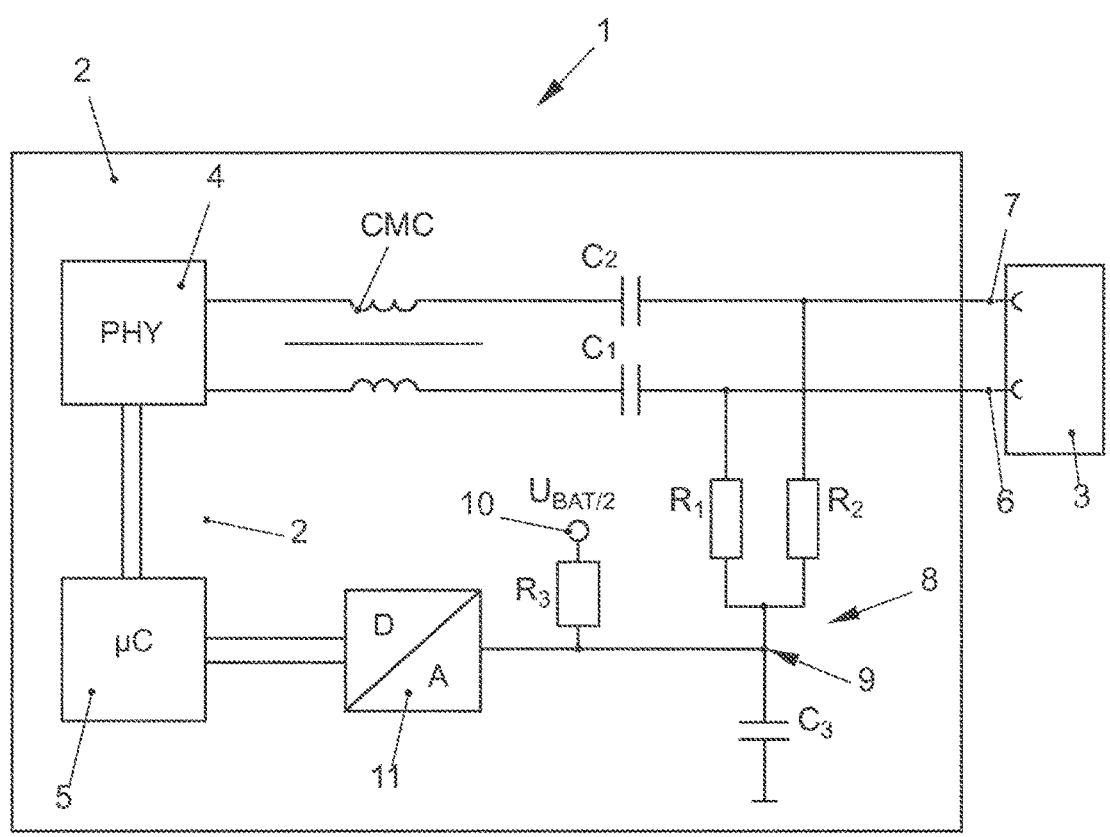

BUS SYSTEM AND METHOD FOR DIAGNOSING A SHORT CIRCUIT

PRIORITY CLAIM

This patent application is a U.S. National Phase of International Patent Application No. PCT/EP2016/073921, filed 6 Oct. 2016, which claims priority to German Patent Application No. 10 2015 221 848.1, filed 6 Nov. 2015, the disclosures of which are incorporated herein by reference in their entireties.

SUMMARY

Illustrative embodiments relate to a bus system, in particular, an Ethernet bus system, and to a method for diagnosing a short circuit in such a bus system.

BRIEF DESCRIPTION OF THE DRAWINGS

Disclosed embodiments are explained in more detail below with reference to the single drawing, in which:

FIG. 1 shows a part of a bus system.

DETAILED DESCRIPTION

In bus systems, which, for functional reasons, have capacitors for DC voltage decoupling in the signal path, the bus drivers cannot identify short circuits in a signal line to ground or to the supply voltage. Short circuits in individual bus lines (permanently or sporadically) to ground or to the supply voltage lead to asymmetry in the transmission system and make it unreliable.

Such a bus system having coupling capacitors is, for example, an Ethernet bus system, which are also increasingly being used in motor vehicles.

In addition to the bus driver, a bus interface, for example, IEEE 100Base-T1 Ethernet, has a common-mode choke, coupling capacitors in the signal path and a common-mode termination, consisting of two resistors and a capacitor. Data is transmitted by a differential AC voltage between the two bus lines, wherein only the difference and not the absolute level with reference to ground is perceptible for the bus driver.

Disclosed embodiments provide a bus system having coupling capacitors in the signal path, in which permanent or sporadic short circuits to ground or to the supply voltage are detected without disrupting the symmetry of the data transmission. A further problem is providing a corresponding method.

The bus system has at least two control devices, which each have a bus driver, wherein the bus drivers are connected to one another by two bus lines. In each case, at least one coupling capacitor is arranged on the bus lines, wherein a termination network is connected to the bus lines, the termination network consisting of at least two resistors and a capacitor. Here, each resistor is connected to a respective bus line and the two resistors are connected to one another at a center tap of the termination network. The capacitor of the termination network is between the center tap and a ground connection. The bus system further has a reference voltage source, wherein the reference voltage source is connected to the center tap by an element. The element is intended to ensure that the voltage at the center tap can change. The voltage of the reference voltage source has a value between an operating voltage (maximum short-circuit voltage occurring) and ground (0 V). In this case, at least one control device of the bus system is configured in such a way that the voltage level at the center tap is detected and, depending on the detected voltage level, the control device detects whether there is a short circuit in a bus line to the operating voltage or to ground. As a reaction to this, the control device can then initiate a fault message or other suitable warnings or countermeasures. This makes use of the fact that the short circuit to the operating voltage or to ground in the bus line also draws the voltage level at the center tap to the potential. This change can then be detected by the control device, wherein the element prevents the potential at the center tap from being kept constant by the reference voltage source, making it possible for the potential to drift instead. In this case, the control devices can also be configured as switches.

In at least one disclosed embodiment, the element is configured as a high-impedance resistor, such that, in the event of a short circuit to ground, the current through the element is very low. The resistance may be greater than 1 MΩ. The resistor can be realized as an ohmic resistor or by a transistor circuit.

In a further disclosed embodiment, the voltage level of the reference voltage source is half of the operating voltage. The voltage level at the center tap is therefore exactly between the two extremes based on a short circuit, namely between ground and the operating voltage. This accordingly simplifies the detection of a short circuit, since the change in voltage at the center tap has a correspondingly large swing.

In a further disclosed embodiment, the evaluation is performed by a microprocessor of the control device.

In a further disclosed embodiment, an A/D converter is arranged between the center tap and the microprocessor of the control device, the A/D converter making digital evaluation possible.

In a further disclosed embodiment, at least one common-mode choke is integrated into the bus line or into the control device.

In a further disclosed embodiment, the control device is configured in such a way that the voltage level of the center tap is evaluated at least over a prescribed observation time, wherein a short circuit is inferred only when the voltage level has changed over the observation time from the voltage level based on the reference voltage source to the other potential (ground or operating voltage). In this case, the observation period may be >1 ms. This prevents instances of common-mode interference from being perceived as a short circuit on account of instances of high-frequency EMC interference or interference pulses.

An area of application of the bus system is the use in a motor vehicle.

The bus system 1 comprises a first control device 2 and a second control device 3. The control devices 2, 3 each have a bus driver 4 and a microprocessor 5, which are not illustrated for the second control device 3. The control devices 2, 3 and the bus drivers 4 thereof are connected to one another by two bus lines 6, 7. A coupling capacitor C1, C2 is respectively arranged in the control devices 2, 3. Furthermore, a common-mode choke CMC is integrated into the control device 2, 3. The coupling capacitors C1, C2 and the common-mode choke CMC are in this case arranged between the bus driver 4 and the bus lines 6, 7. The control device 2, 3 furthermore has a termination network 8, which is composed of two resistors R1, R2 and a capacitor C3. In this case, the resistor R1 is connected to the one bus line 6 and the resistor R2 is connected to the other bus line 7, wherein the two resistors R1, R2 are connected to one another at a center tap 9 of the termination network 8. The capacitor C3 of the termination network 8 is between the center tap 9 and ground. A reference voltage source 10 is connected to the center tap 9 by a high-impedance resistor R3. The voltage level of the reference voltage source 10 is in this case half of the operating voltage UBAT. Furthermore, the microprocessor 5 of the first control device 2 is connected to the center tap 9 by an A/D converter 11.

In normal operation, the center tap 9 is at the voltage level of the reference voltage source 10, since the capacitor C3 illustrates an infinitely high resistance in terms of DC voltage. The A/D converter 11 converts the analog voltage value to a digital signal, which is evaluated by the microprocessor 5. If a short circuit in one of the bus lines 6, 7 to ground now occurs, the potential of the center tap 9 is also drawn to ground potential. In the event of a short circuit in a bus line 6, 7 to the operating voltage UBAT, the voltage level at the center tap 9 is correspondingly drawn to the operating voltage UBAT.

This change in voltage is then detected by the microprocessor 5, which can then initiate appropriate measures. To differentiate a short circuit from instances of temporary interference on account of EMC signals or interference pulses, the microprocessor 5 evaluates the duration of the changed voltage level, that is to say it identifies a short circuit only when the change in voltage level at the center tap 9 continues over a relatively long period of, for example, greater than 1 ms.

The invention claimed is:

1. A bus system comprising:
    at least two control devices, each of the at least two control devices having a bus driver, the bus drivers connected to one another by a first bus line and a second bus line, a first coupling capacitor arranged on the first bus line and a second coupling capacitor arranged on the second bus line; and
    a termination network connected to the first and second bus lines, the termination network including a first resistor, a second resistor, and a reference capacitor, the first resistor connected to the first bus line and the second resistor connected to the second bus line, the first and second resistors connected to one another at a center tap, the reference capacitor of the termination network located between the center tap and a ground connection,
    wherein the bus system has a reference voltage source connected to the center tap by an element, a voltage value at the reference voltage source less than an operating voltage of the bus system and greater than ground, and
    wherein at least one control device is configured to detect a voltage level at the center tap and to identify a short circuit in one of the first and second bus lines in response to the voltage level at the center tap being different from the voltage value at the reference voltage source by a predetermined amount.

2. The bus system of claim 1, wherein the element is resistor having an impedance of greater than about 1 MΩ (Megohm).

3. The bus system of claim 1, wherein the voltage value at the reference voltage source is half of the operating voltage.

4. The bus system of claim 1, wherein a microprocessor of the control device is configured to detect the voltage level of the center tap and to identify the short circuit.

5. The bus system of claim 4, wherein an A/D (Analog-to-digital) converter is arranged between the center tap and the microprocessor.

6. The bus system of claim 1, wherein a common-mode choke is integrated into the bus lines or the control device.

7. The bus system of claim 1, wherein the short circuit is identified in response to the voltage level at the center tap being different from the voltage value at the reference voltage source by the predetermined amount over a predefined observation time.

8. The bus system of claim 1, wherein the short circuit is identified in response to the voltage level at the center tap being substantially the same as one of the operating voltage or ground.

9. A method for diagnosing a short circuit in a bus system, the bus system having at least two control devices, each of the at least two control devices having a bus driver, the bus drivers connected to one another by a first bus line and a second bus line, a first coupling capacitor arranged on the first bus line and a second coupling capacitor arranged on the second bus line, and a termination network connected to the first and second bus lines, the termination network including a first resistor, a second resistor, and a reference capacitor, the first resistor connected to the first bus line and the second resistor connected to the second bus line, the first and second resistors connected to one another at a center tap, the reference capacitor of the termination network located between the center tap and a ground connection, a reference voltage source of the bus system connected to the center tap by an element, a voltage value at the reference voltage source less than an operating voltage of the bus system and greater than ground, the method comprising:
    detecting a voltage level at the center tap; and
    identifying a short circuit in one of the first and second bus lines in response to the voltage level at the center tap being different from the voltage value at the reference voltage source by a predetermined amount.

10. The method of claim 9, wherein the element is a resistor having an impedance of greater than about 1 MΩ (Megohm).

11. The method of claim 9, wherein the voltage value at the reference voltage source is half of the operating voltage.

12. The method of claim 9, wherein a microprocessor of the control device detects the voltage level of the center tap and identifies the short circuit.

13. The method of claim 12, wherein an A/D (Analog-to-digital) converter is arranged between the center tap and the microprocessor.

14. The method of claim 9, wherein a common-mode choke is integrated into the bus lines or the control device.

15. The method of claim 9, wherein the short circuit is identified in response to the voltage level at the center tap being different from the voltage value at the reference voltage source by the predetermined amount over a predefined observation time.

16. The method of claim 9, wherein the short circuit is identified in response to the voltage level at the center tap being substantially the same as one of the operating voltage or ground.

* * * * *